United States Patent
Chi et al.

(10) Patent No.: US 7,564,105 B2
(45) Date of Patent: Jul. 21, 2009

(54) QUASI-PLANNAR AND FINFET-LIKE TRANSISTORS ON BULK SILICON

(75) Inventors: Min-Hwa Chi, Palo Alto, CA (US);
Wen-Chuan Chiang, Hsin-Chu (TW);
Mu-Chi Chiang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 353 days.

(21) Appl. No.: 11/094,879

(22) Filed: Mar. 30, 2005

(65) Prior Publication Data

US 2005/0239254 A1 Oct. 27, 2005

Related U.S. Application Data

(60) Provisional application No. 60/565,038, filed on Apr. 24, 2004.

(51) Int. Cl.
*H01L 27/088* (2006.01)
(52) U.S. Cl. .................... 257/401; 257/E29.13
(58) Field of Classification Search ................ 257/401, 257/E29.13
See application file for complete search history.

(56) References Cited

U.S. PATENT DOCUMENTS

| | | | |
|---|---|---|---|
| 6,642,090 B1 * | 11/2003 | Fried et al. ............... | 438/164 |
| 2003/0215990 A1 * | 11/2003 | Fitzgerald et al. .......... | 438/172 |
| 2004/0031979 A1 * | 2/2004 | Lochtefeld et al. .......... | 257/233 |

* cited by examiner

*Primary Examiner*—Bradley K Smith
*Assistant Examiner*—Amar Movva
(74) *Attorney, Agent, or Firm*—Tung & Associates

(57) ABSTRACT

The types of quasi-planar CMOS and FinFET-like transistor devices on a bulk silicon substrate are disclosed. A first device has a doped and recessed channel formed in a shallow trench sidewall. A second device has a doped, recessed channel and has a plurality of edge-fins juxtaposed on an edge of an active region of the device. A third device has an undoped recessed channel formed in a sidewall of a shallow trench, wherein the undoped recessed channel further has a plurality of edge-fins disposed thereon. Additionally, an extra mask may be added to each device to allow for fabrication of both conventional transistors and FinFET-like transistors on bulk silicon. The extra mask may protect the source and drain areas from recess etching of the silicon substrate. Several methods of fabricating each device are also disclosed.

39 Claims, 4 Drawing Sheets

US 7,564,105 B2

QUASI-PLANNAR AND FINFET-LIKE TRANSISTORS ON BULK SILICON

RELATED APPLICATION

This is a utility application of provisional application no. 60/565,038, filed Apr. 24, 2004.

FIELD OF THE INVENTION

The present invention generally relates to FinFET technology and more particularly, relates to quasi-planar CMOS and FinFET-like transistors fabricated on bulk silicon wafers (referred to as bulk-FinFET or FinFET-on-bulk) with enhanced drive current and suppressed short-channel effects and associated fabrication methods.

BACKGROUND

Performance enhancement between generations of conventional CMOS integrated circuit is generally achieved by applying shorter gate length and thinner gate oxide in MOS transistors fabricated on bulk or silicon-on-oxide (SOI) wafers. This is generally referred to as the "scaling" of MOS transistors.

Metal-Oxide-Semiconductor-Field-Effect-transistors (MOSFETs), having a source, a drain region, and a gate electrode formed using a gate oxide, are commonly used in IC devices. As the gate oxide becomes thinner, the transistors be powered with a lower voltage to avoid breakdowns and leakage through the gate-oxide.

Additionally, as CMOS transistors on bulk silicon are scaled to channel lengths below 100 nm, conventional CMOS transistors suffer from degraded performance as resulting from leakage currents that occur through channels, junctions, and gate dielectrics. In particular, interactions between the source and drain of the CMOS device, typically results in both Vt roll-off and poor sub-threshold swing, degrade the ability of the gate to control whether the transistors is on or off. This phenomenon is typically referred to as the "short-channel effect".

To overcome the degraded performance of CMOS fabricated on bulk silicon, CMOS transistors fabricated on SOI structure may be used.

In the generation of layouts, a MOSFET transistor can typically be defined by a silicon active area that-intersects with one or more polysilicon lines. The silicon active area is often a two-dimensional, planar layer of silicon.

MOSFETs fabricated on SOI are formed with an insulator (usually, silicon dioxide, and referred to as buried-oxide or "BOX") below the device active region, unlike conventional "bulk" MOSFETs, which are formed directly on silicon substrates, and hence, have silicon below the active region. The use of SOI MOSFETs increases device speed over that of CMOS on bulk through smaller sub-threshold voltage swings (i.e. better switching off performance). Additionally, there is reduced coupling between the source and the drain of the MOSFET on SOI as blocked by the "BOX" layer below the channel as well as the source and drain. As device size is scaled, however, this becomes increasingly difficult, since the distance between the source and drain is reduced, and hence, both the source and the drain increasingly interact with the channel, thus reducing gate control and increasing short channel effects (SCE).

As shown in prior art FIGS. 1-2, a FinFET on SOI structure 10 has a thin channel or "fin" region disposed on a SOI. The fin 12 is a silicon shape built on Silicon On Insulator (SOI) with "BOX" 16 and silicon substrate 14, and extends vertically out of the plane of the substrate. The vertical sides of the fin (together with the top planar portion) can be utilized to form the channel of FETs. These FETs incorporated into fin structures are referred to as FinFETs (also commonly referred to as double-gate FinFET or tri-gate transistor in literature). Several embodiments of FinFET transistors on SOI wafer are disclosed in detail in Hu, U.S. Pat. No. 6,413,802 B1, issued on Jul. 2, 2002, which is herein incorporated by referenced.

The FinFET structure on SOI 10 has at least one thin vertical fin 12 and self-aligned gates 18 "wrapped around" or over both sides and the top of the at least one thin vertical fin 12. The thin vertical fin can result in the well-known "thin-body" effects, e.g. enhanced mobility and volume inversion. The "wrap around gate" 18 places a gate so that it completely or almost-completely surrounds the fin 12 or channel and thus, provides excellent gate control for turn-off and turn-on performance with the known advantages of "thin-body" effects. The SCE is also improved due to the elimination of electrostatic coupling between the source and drain by the buried oxide (BOX) layer 16 disposed beneath the device active area.

Preferably, a wider channel transistor 19 may be formed by multiple fins 21 in parallel with a common gate 23 as shown in FIG. 3.

Both the CMOS and FinFET on SOI of prior art FIGS. 1, 2a-f, and 3 have demonstrated superior performance over planar CMOS on bulk silicon in suppression of short-channel effects and reducing leakage currents.

The fabrication of prior art FinFET on SOI structure is in a similar manner to that of planar CMOS on bulk silicon. Prior art FIG. 1 is an illustration of a FinFET transistor on SOI having one silicon fin. The fin 12 has a thickness (or width) of about 10 nm and can be formed using existing technology such as e-beam lithography.

Typically, the width, or thickness of each silicon fin ranges between 10 to 40 nm. Additionally, the height of the fin ranges between 30 to 100 nm. The height-to-width ratio or "aspect ratio" of the fin, approximately in the range of 1 to 3, is higher than that of a planar CMOS fabrication process.

In general, all of the thin fins have the same height and thickness (or width). Wide transistors can be formed by providing parallel multi-fins that share a common gate (see FIG. 3).

As shown in FIGS. 2a-f, the fabrication of FinFET on SOI is similar to that of conventional planar CMOS fabricated on bulk silicon as is well known by a person of ordinary skill in the art.

Prior art FIGS. 2a-f illustrate the process of fabricating a FinFET on SOI structure.

FIG. 2a shows Fin formation by patterning, etching, and Vt implanting. The silicon fins (un-doped) 12 are formed first by fine lithography (e.g. e-beam) and then followed by silicon etching and an optional Vt implant 24. As shown in FIG. 2a, the Vt implantation after silicon etching is optional for adjustment of Vt depending on which gate conduction materials are used.

Unlike the fabrication of CMOS on bulk substrate, a formation of shallow trench isolation (STI) is not necessary because the buried oxide layer of SOI provides good isolation.

As shown in FIG. 2b, after the fin patterning process is performed, the surface of the fin 12 is oxidized to form a gate oxide (GOX). Next, after gate oxidation, a gate conductor film, preferably selected from at least one of poly-Si, Mo, and TiN, is deposited over the silicon fin and is patterned as the gate conductor 18. Preferably, the gate is patterned by an etching process to form perfectly aligned gates straddling over the two sidewalls of the patterned fin. The resulting channel width is calculated to be about 2 times the fin-height associated with each fin, wherein the fin-height is the thickness of the silicon layer of the FinFET on SOI structure.

The threshold voltage, Vt, of the device can be controlled by adjusting the work function of the gate conduction material using a refractory metal, a compound such as titanium nitride, or an alloy such as silicon-germanium alloy. The Vt is determined as well-known in the art by the work function of the gate conduction material and a density value of carriers in the silicon fin at an on-state.

FIG. 2c illustrates a selective implantation of a lightly doped drain ("LDD") region using a large tilt angle implant 28 into the selective surface of the substrate, thus providing uniformity. The arrows in different angles in FIG. 2c schematically represent the "large angle tilting" during implanting. The photo resist 20 pattern is formed by a typical masking step. The selective LDD implant is therefore performed for n-channel and p-channel regions respectively.

As shown in FIG. 2d, a spacer 30 is formed on the sidewall of the gate 18 and the fin (not underneath the gate) by deposition and a chemical removal process (eg. etch-back technique). The spacer material is typically silicone dioxide or silicon nitride.

After the spacer is formed, the silicon portion of the fin is exposed (i.e. the portion not underneath the gate and the spacer) to form the source and the drain by heavy N+ or P+ implant using masking steps (not shown in FIG. 2d).

As shown in FIG. 2e, a thin layer of silicide 32 is performed using the well-known self-aligned silicide technology. The process of silicides consumes a small amount of silicon at the source and the drain area. Possible silicides include nickel silicide or palladium silicide, and are not limited to commonly used silicides, e.g. titanium silicide and cobalt silicide.

Alternatively, another selective conductor deposition process such as selective metal, polysilicon, or epitaxial silicon deposition may be performed as shown in FIG. 2e to replace the silicide layer 32.

SOI technology further improves the speed and reduces the operating power of the circuits. The BOX layer not only reduces the capacitance of the source and the drain junction so it operates faster, but also eliminates the coupling between the source and the drain, which degrades transistor performance (i.e. short channel effects in Vt roll-off, sub-threshold swing, and higher leakage current) in the case of CMOS on bulk technology.

The FinFET on SOI technology is generally superior to planar CMOS, however, the FinFET on SOI device has a quasi-planar surface that imposes significant challenges in processing including: providing a suitable SOI substrate, performing fine lithography, performing etching with a high aspect ratio, using a large tilt angle implant to produce a uniformly doped source and drain, and LDD regions. The source and drain regions are actually located "above" the lowest channel region of the FinFET, thus, the source and drain regions of FinFET are the "raised source and drain" with known advantages of reducing coupling between the source and drain through the channel region.

Additionally, FinFET as any MOS transistors fabricated on SOI wafers suffer from a "floating body effect". The floating body effect occurs as a result of the floating channel region, where it can be electrically charged to various voltage levels during switching on and off. This floating body effect leads to a less reproducible behavior of the transistors. MOS transistors fabricated on bulk have no "floating body effects", since the channel region is electrically connected to the substrate.

Therefore, it is an object of the present invention to overcome the disadvantages of both planar CMOS and FinFET on SOI technology.

SUMMARY OF THE INVENTION

The present invention provides a combination of quasi-planar CMOS and FinFET-like transistor technology fabricated on bulk silicon wafers to bridge the gap between current planar CMOS to overcome scaling difficulties of short channel effects and future thin FinFET on SOI (to eliminate the "floating body effects").

In a preferred embodiment of the present invention, the device of the present invention provides a silicon semiconductor substrate having a top surface or top wall and at least one recessed region (commonly referred to as STI trench), wherein said at least one recessed region has a side-wall and a bottom wall; a portion of an insulating layer formed in the bottom portion of said recessed region (or STI trench); and a doped region at said side-wall of said recessed region.

In another preferred embodiment, a quasi-planar transistor device can be formed by providing a bulk semiconductor substrate; and recessing the oxide inside the STI trench (referred to as STI oxide) partially, so that the STI sidewall of silicon is exposed and defines a transistor channel, having a proper Vt implant.

In an alternative embodiment, after an STI trench is formed and filled with oxide, a quasi-planar transistor can be formed by slightly etching (i.e., recessing) by a chemical removal process (eg. Reactive ion etch or wet chemical etch) the silicon substrate to form a thin small silicon spacer at the edges of the active area; and then partially etching (i.e. recessing) the oxide inside the STI trench to expose the STI sidewall of silicon, wherein the sidewall and the surface of the silicon spacer defines a transistor channel and receives a Vt implant.

In another embodiment of the present invention, quasi-planar transistor channel is formed on a narrow and undoped silicon region between STI trenches, that allows the quasi-planar transistors to perform in a similar manner to a FinFet transistor having "thin body" effects. The raised source and drain provides advantages of reduced coupling between the source and drain, but there is an extra leakage path from the source and the drain to the bulk silicon. However, the present invention eliminates the "floating body effects" that occur in a FinFET on SOI device.

Additionally, another embodiment of the present invention applies an extra mask to allow for conventional CMOS transistors and FinFET-like transistors to be fabricated on bulk wafers together if so desired.

The present invention provides quasi-planar transistors having a doped channel with an enhanced channel width without increasing junction leakage. The gate wrapped over the edge fins and side-wall of the trench offers excellent control of the channel. Additionally, the source and drain is raised substantially above the side-wall of the trench channel, thereby significantly improving short-channel effects by suppressing the electrostatic coupling between the source and drain through the bulk silicon.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENTS

The present invention provides a combination of quasi-planar CMOS and FinFET-like transistor technology on bulk silicon that has improved device characteristics and performance over that of planar CMOS and FinFET on SOI technologies.

In general, a semiconductor substrate is provided. Preferably, the substrate is a silicon material. The substrate has at least one, but preferably two recessed regions or "STI trenches" formed therewithin, each having a side-wall and a bottom portion, each bottom portion having a bottom wall. The two STI trenches are spaced apart by a top surface (or top wall) of the silicon substrate, wherein the channel of the active region is defined by the top wall of the silicon substrate and the two side-walls of each trench, wherein each of the side-walls is juxtaposed to an edge of an active area of the transistor.

A source and a drain of the transistor device are disposed on the top wall of the silicon substrate between each of the two shallow trenches. A gate conductor is formed along the top wall of the silicon substrate and the side-wall of each trench by overlapping each of the STI trenches such that the gate conductor also overlaps each of the side-walls of the STI trenches defining the channel area. The STI trench side-walls forming the channel, the gate, the source, and the drain are formed as the MOS transistor.

Optionally, a recessed silicon region having edge spacers or fins is disposed between the two STI trenches.

Additionally, in one embodiment of the present invention, the quasi-planar transistors of the present invention provide a source and a drain that are raised above the side-wall of the STI trench.

Figure 1:
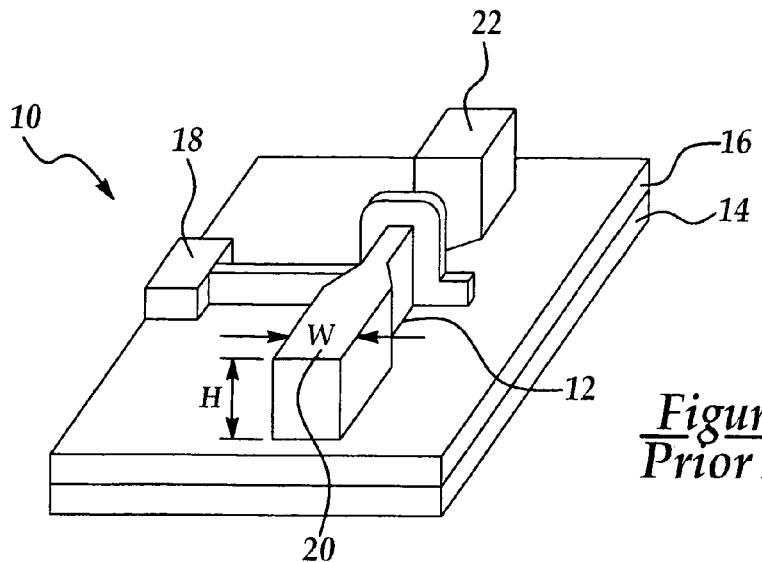
FIG. 1 is an illustration of a prior art FinFET transistor on SOI having one silicon fin.
Figure 2A:
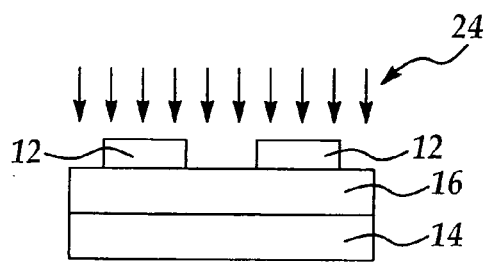
FIG. 2a is an illustration of a prior art Fin patterning, etching, and a Vt implanting process.
Figure 2B:
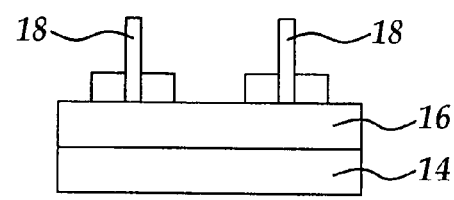
FIG. 2b is an illustration of a prior art gate patterning process.
Figure 2C:
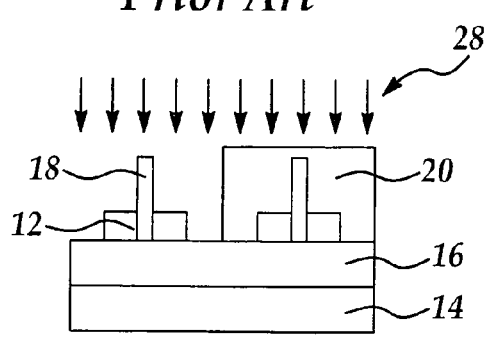
FIG. 2c is an illustration of a prior art tilt angle implantation of a lightly doped drain process on a selective region (i.e. n-channel or p-channel).
Figure 2D:
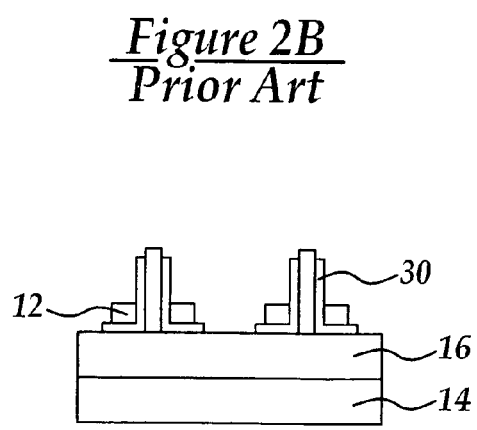
FIG. 2d is an illustration of a prior art spacer formation process.
Figure 2E:
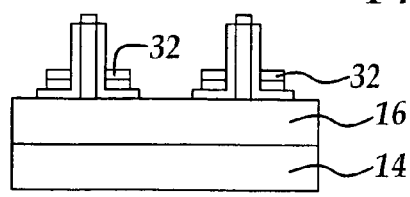
FIG. 2e is an illustration of silicide formation or a deposition of a prior art conduction layer process on the source and drain regions.
Figure 3:
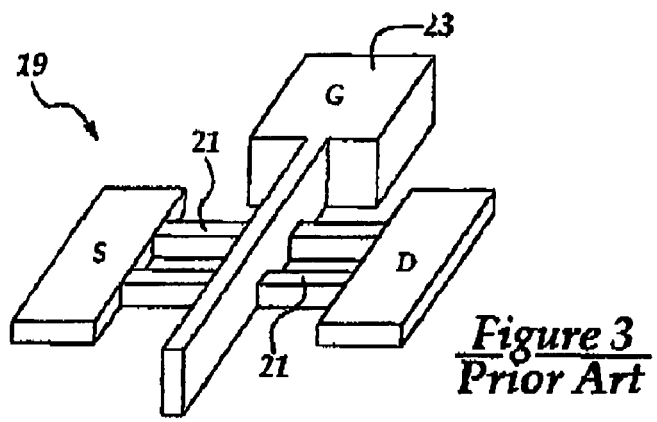
FIG. 3 is an illustration of a prior art FinFET transistor on SOI having two silicon fins sharing a common gate.
Figure 4:
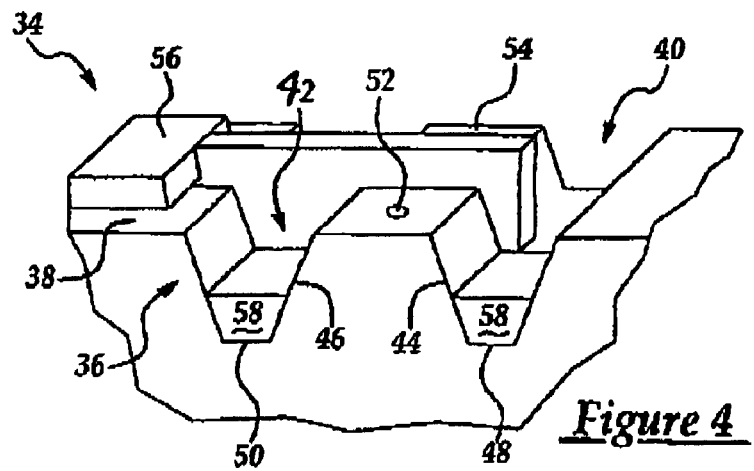
FIG. 4 is a cut away of a partial perspective view of a FinFET-like transistor on a bulk substrate having a doped channel region in accordance with the present invention.

Referring now to the drawings, FIG. 4 illustrates a preferred embodiment of the present invention. More particularly, FIG. 4 shows a quasi-planar transistor device 34 of the present invention having:

a bulk silicon substrate 36 having a top surface 38 defining an active area of the transistor device;

a first recessed trench region 40 defining an STI trench, the first recessed region 40 has at least one side-wall 44 and a bottom wall 48, such that the side-wall 44 is disposed between the top surface 38 of said silicon substrate 36 and extends down outwardly from the top surface 38 towards the bottom wall 48, and wherein the side-wall 44 of the first recessed region 40 defines a channel of the transistor device 66.

Preferably, a second recessed trench region 42 also having a side-wall 46 and a bottom wall 50 is spaced a pre-determined distance apart from the first recessed region 40.

In one embodiment, shown in FIG. 4, a quasi-planar transistor can be formed by:

providing a bulk semiconductor substrate; forming at least one recessed region or STI trench having a STI trench side-wall; and recessing a STI oxide partially, so that the STI sidewall of silicon defines a transistor channel; having a proper Vt implant.

FIG. 4 illustrates a quasi-planar CMOS device having a doped channel formed by the STI trench side-wall.

Initially at least one shallow trench is formed, see FIG. 4, using methods including forming a pad-oxide layer (not-shown), preferably having a thickness ranging between about 50 Å to 150 Å, forming a patterned layer of photo resist on the surface of the substrate and then etching through the pad-oxide layer into the surface of the substrate.

An insulating layer 58, is formed within each STI trench. Preferably, the insulating layer is only partially formed within a bottom portion of each STI trench 40, 42, thus, leaving an upper portion of each trench side-wall exposed. The insulating layer may fill the trench from the bottom of each trench up to about 80% of the trench depth Td. However, in a preferred embodiment, only 20% of the total trench depth is filled. Alternatively, in another preferred embodiment, the insulating layer fills the trench between 10% and 30%, and alternatively, in another preferred embodiment, the insulating layer fills between 10% and 50% of the trench. Preferably, the insulating layer is an oxide layer. The oxide layer 58 may be thermally grown, e.g., utilizing a furnace or a rapid thermal process (RTP) such as an ISSG RTP or such as a rapid thermal oxidation ("RTO") process, or deposited, e.g., utilizing chemical vapor deposition ("CVD") or sub-atmospheric CVD (SACVD). Additionally, a trench fill process such as HDP (High Density Plasma) may be used. One skilled in the art will recognize that the HDP oxide deposition fills in from the bottom to the top in contrast to conformal deposition, where the oxide layer thickness is deposited uniformly. The HDP is deposited and then etched back by a wet chemistry. Due to the fact that the HDP oxide deposition covers the bottom horizontal walls 48, 50 with a faster deposition than the trench side-walls 44, 46, the sidewalls can be subsequently cleaned without etching away the oxide on the horizontal areas.

As shown in FIG. 4, the STI oxide layer of the silicon substrate 36 is recessed to about 50% of the STI trench depth Td. The Vt associated with the side-wall channel may be adjusted by implanting proper dopants using a large tilt angle implant.

The side-walls 44, 46 of STI trenchs 40, 42 and the top surface contributes collectively to the conduction of current flowing through the channel. Therefore, the total channel width of the MOS transistor of the present invention is the sum of the width of two "side-wall channels" and the "top channel" (as also named as "tri-gate" transistor in some literature). In contrast, the channel width of a conventional planar MOS transistor is only contributed from the top surface. The amount that the STI oxide is recessed determines the width of the "side-wall channel". The gate formed along the top surface and the two side-wall channels provides excellent gate control of the transistor channel, in a similar manner to the control provided by a double-gate transistor on SOI as known in literature.

In a preferred embodiment, CMOS transistors using layout rules of 90 nm CMOS technology node may be formed using the method as illustrated in FIG. 4 and 8a-f. For a 90 nm CMOS node, the STI trench is about 0.35 µm deep. The channel width associated with the two side-wall is also equal to about 0.35 µm when assuming the oxide recess is about 50% of the trench depth. Therefore, if assuming the top channel width is 0.35 µm as used in SRAM cell, then the total channel width of transistor of the present invention is about three times the channel width of conventional transistor. A transistor having an equal gate length but a wider channel width will conduct more current, and leads to faster speed than another transistor.

Figure 8A:
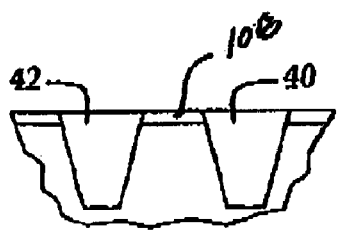
FIG. 8a illustrates shallow trench formation in a recessed silicon substrate.
Figure 8B:
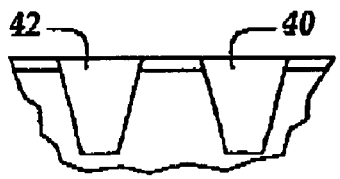
FIG. 8b illustrates an optional field implantation process used to improve isolation.
Figure 8C:
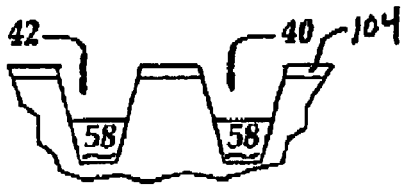
FIG. 8c illustrates recessing of an oxide layer.
Figure 8D:
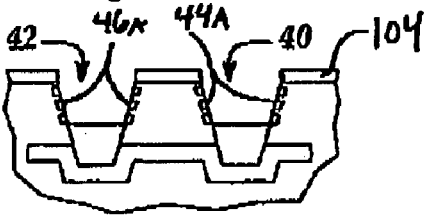
FIG. 8d illustrates a large tilt angle implantation process performed on a STI trench side-wall.

The fabrication method of the preferred embodiment is now described below with illustrations in FIG. 8. FIG. 8a shows the cross-sectional view after STI formation. The remaining nitride and pad oxide 106 is over the silicon active area. As shown in more detail in FIG. 8b, after the STI formation (FIG. 8a), an optional field implant can be added to improve isolation. The STI trench oxide layer is preferably recessed to about 50% of the trench depth using a self-aligned trench oxide etch or using a nitride to form a hard mask (FIG. 8c). Preferably the nitride mask layer 104 has a thickness ranging between about 100 to 500A. As shown in FIG. 8d, a large tilt angle implant is performed on the STI trench side-wall to form doped sidewall region e.g., 44A and 46A that defines the channel to allow adjustment of the Vt.

Optionally, an implant using nitrogen as a source, at an energy of about 10 Kev and a dosage of in the range between about 1E13 to 1E15 atoms/cm$^2$, is performed on the side-wall of the STI trench to allow for slower gate oxidation on the side-wall, thus allowing for the final gate-oxide to be equally thick on both the side-wall of the STI trench and the top silicon area.

Next, the nitride layer is removed preferably by a wet $H_3PO_4$ acid. The pad oxide layer is then removed and followed by oxidation again of the semiconductor substrate to form a thin sacrificial oxide layer, preferably in thickness between about 50 to 100 Å, in the active areas in particular, usually referred to by the person of ordinary skill in the art as the "Sac-ox" layer. This oxidation typically precedes the various implantations.

After the sac-ox is grown, p-type and n-type well implants are implanted. After well implantation is performed, the Sac-ox (sacrificial oxide) layer is removed. A gate dielectric layer 58A with a dielectric constant no less than about 4 (e.g., Silicon oxide) is grown with a thickness ranging between 10 Å and 70 Å.

Figure 8E:
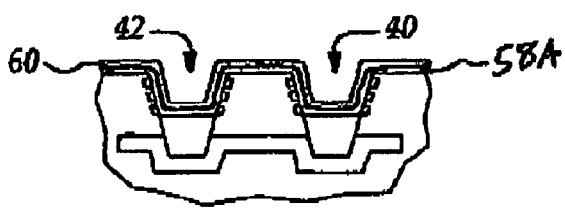
FIG. 8e illustrates deposition of a $1^{st}$ doped polysilicon deposition layer.

Next, as shown in FIG. 8e, a first silicon containing layer (eg. doped polysilicon layer, or a silicide metal gate electrode layer) 60 having a thickness in a range of 400 Å to 800 Å is deposited to reduce depletion along the trench side-wall. Polysilicon is the preferable gate electrode material used in MOS devices.

Figure 8F:
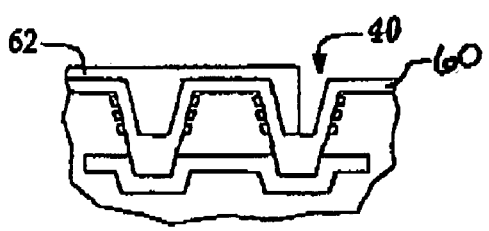
FIG. 8f illustrates deposition a second polysilicon deposition layer.

As shown in FIG. 8f, a second silicon containing layer (e.g., non-doped polysilicon layer) 62 having a thickness in a range of 400 Å to 800 Å is deposited on the first silicon containing layer 60 (gate dielectric layer 58A not shown).

Then, the gate electrode (polysilicon) is patterned by the masking and plasma etching steps. The source 54 and drain 52 regions are defined.

Figure 7:
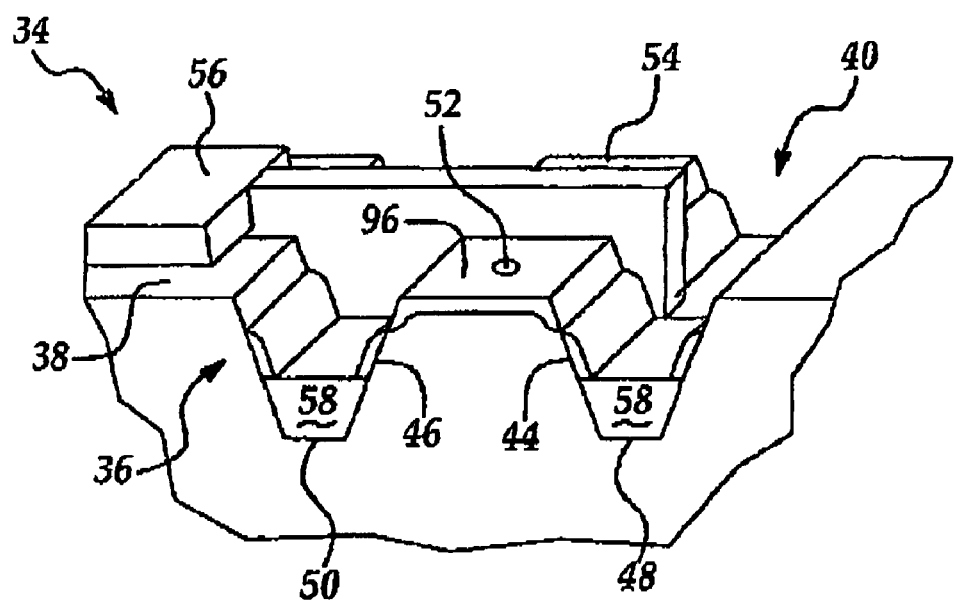
FIG. 7 is a cut away partial perspective view of a FinFET-like device having an undoped channel region and a raised source and drain having a top silicide layer.

In another embodiment of the present invention, shown in FIG. 7, a narrow, undoped silicon channel is provided that allows the quasi-planar transistors to perform in a similar manner to a FinFet-like transistor having the advantages of "thin body" effects. The raised source and drain provides an extra leakage path from the source and the drain to the bulk silicon, however, the present invention eliminates the "floating body effects" that occur in a FinFET on SOI.

FIG. 7 is similar in structure to the device shown in FIG. 4, with the exception that the silicon channel is narrow and left un-doped. The source 54 and the drain 52 regions are also substantially raised above the trench side walls 44 and 46 (as similar in FIG. 4) and include a silicide layer 96 formed using a silicidation process as disclosed herewithin.

As scaling continues, the minimum width of active area may be reduced to about 80 nm in the 65 nm CMOS technology node, which is "thin" enough to provide "thin-body" effect of enhanced mobility and volume inversion. FIG. 7 illustrates a FinFET-like transistor on bulk silicon having an un-doped trench sidewall and minimum width of silicon channel region (e.g. about 80 nm at 65 nm CMOS node) that provides "thin-body" advantages in addition to other advantages of quasi-planar transistor (i.e. reduced short-channel effect, better switching characteristics due to better gate-control).

FIG. 7 illustrates the FinFET-like transistor on bulk silicon after a silicidation process is performed. As shown in FIG. 7, the silicided source and drain area 96 are substantially raised above the side-wall channel to reduce coupling between the source and drain through the bulk silicon.

Conceptually, the FinFET-like transistor on bulk silicon of the present invention can be derived from a FinFET on SOI by having a buried oxide layer thinned down to zero thickness. While the present invention may still have leakage current from the source and the drain junction to the bulk silicon, the amount of leakage is much less than the leakage at a junction in common planar CMOS technology. The decrease in leakage is due to less gate induced drain leakage (GIDL) as a result of less pocket implant needed for optimizing Vt roll-off.

Additionally, the source and drain areas are mainly above the trench side-wall channel area and are "raised" to suppress the coupling between the source and drain through the bulk silicon and thus suppress the short-channel effects. There are no "floating body" effects in the FinFET-like transistor on bulk silicon of the present invention, unlike FinFET on SOI, since the silicon channel area or body is electrically connected to the silicon substrate.

Figure 5:
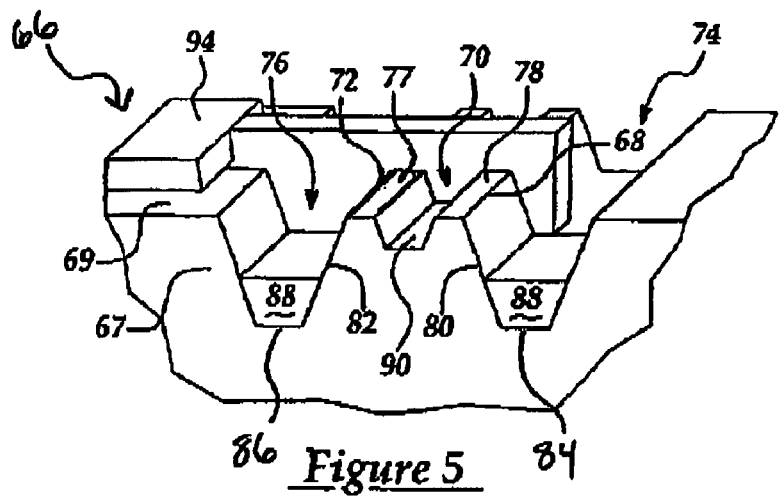
FIG. 5 is a cut away partial perspective view of a FinFET-like device having a doped channel region and edge fins in accordance with the present invention.
Figure 6:
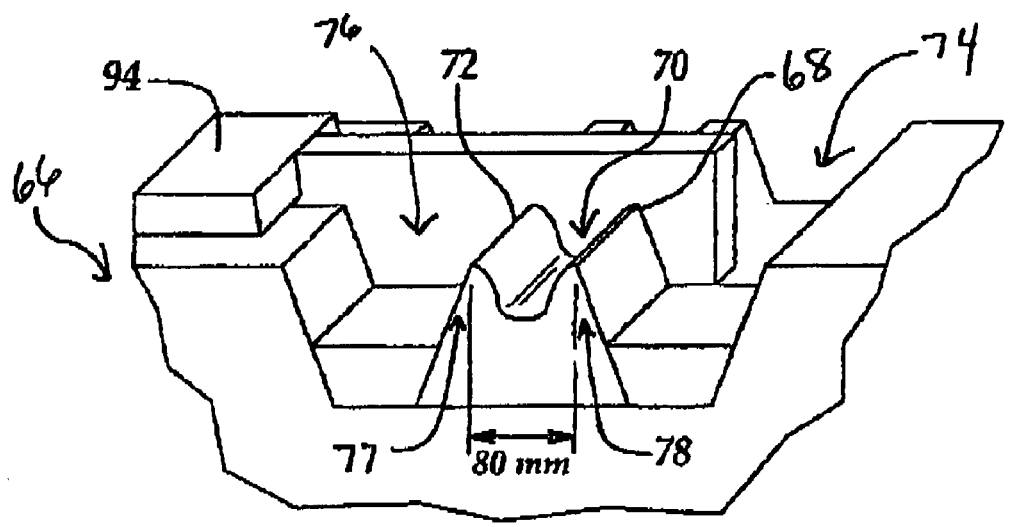
FIG. 6 is a cut away partial perspective view of a FinFET-like device having an undoped channel region and edge fins in accordance with the present invention.

An alternative embodiment of another quasi-planar transistor is shown in FIG. 5-6.

Using the method illustrated in FIGS. 5-6 of the present invention, another quasi-planar transistor can be formed by first partially etching silicon anisotropically to form silicon spacer at edges of active area and next by partially recessing the STI oxide. The narrow or thin spacers (referred to as "edge fins") are similar to the fins in FinFET on SOI and are available to provide a conduction channel. The quasi-planar transistors made in accordance with a preferred embodiment of the invention enhance drive currents of narrow transistors, without increasing junction leakage. Narrow transistors are often used in SRAM cell for minimizing the cell size.

More particularly, FIG. 5 shows a quasi-planar transistor 66 of the present invention having a bulk silicon substrate 67; a top surface 69 defining an active area of the transistor device 66; a first recessed STI trench region 74 defining an STI trench, the first recessed region 74 has at least one side-wall 80 and a bottom wall 84, such that the side-wall 80 is disposed between the top surface 69 of said silicon substrate 67 and extends down outwardly from the top surface 69 towards the bottom wall 84, wherein the side-wall 80 of the first recessed region 74 defines a channel of the transistor device 66.

Preferably, a second recessed STI trench region 76 also having a side-wall 82 and a bottom wall 86 is spaced a pre-determined distance apart from the first recessed region 74.

Additionally, the transistor device 66 has a silicon spacer recessed region 70 having a predefined width disposed between the first and second recessed STI trench regions 74, 76. The spacer region has at least two edge fins, 77 and 78 that are spaced apart a predefined distance, preferably selected from a distance of less than at least 100 nm, 80 nm, 60 nm, 40 nm, 20 nm, and 10 nm. Each of the edge fins 77 and 78 have a narrow width and are aligned with an associated edge 68 and 72, respectively of the device active area.

A quasi-planar transistor can be formed in accordance with a preferred embodiment of the present invention by recessing STI oxide partially, so that a silicon sidewall is also contributing to a conduction channel.

Additionally, a polysilicon gate is formed over the top of the silicon region and side-wall of the recessed region to provide excellent control of the transistor channel, similar to the control provided by FinFET on SOI technology.

As scaling continues to increase, thus allowing for an ever-increasing number of components to be integrated onto a single substrate, providing a narrow and an un-doped channel allows the quasi-planar transistors of the present invention to perform in a similar manner to a FinFET on SOI transistor, and additionally provides the advantage of a "thin-body" and a raised source and drain.

However, leakage current may occur between the source and drain and the bulk silicon, and unlike FinFET on SOI, the present invention does not have a floating channel region and therefore there is no "floating body effect"

FIG. 6 illustrates a quasi-planar transistor having an undoped, narrow channel having a width that is about 120 nm at a 90 nm CMOS node (shown in FIG. 5), and is about 80 nm at a 65 nm CMOS node (shown in FIG. 6). The narrow channel has edge fins and a sidewall. The edge fins are simply small silicon "spacers". The width of the un-doped edge fins is about 40 nm at the 90 nm CMOS node and about 30 nm at the 65 nm CMOS node. Preferably, all thin fins have an equivalent thickness. Wider transistors may be formed by placing a plurality of fins in parallel with a common gate electrode atop. The fabrication method used to form the FinFET-like transistors on bulk silicon as shown in FIGS. 5-6, is similar to the method used in FIGS. 4, and 8a-f, however, only the channel area is left un-doped. Therefore, no Vt implant is necessary using the method of the present embodiment.

The transistor shown in FIG. 6 is formed in a similar manner to the devices shown in FIG. 4, and 8a-f, however, the transistor in FIG. 6 has non-doped spacer recessed region 70 and the trenches 74 and 76. As shown in FIG. 6, after the STI trenches 74, 76 are formed, the silicon is recessed slightly to about 25% of the STI trench depth. The recessed silicon forms, preferably two spacers 78, 77 form at least two edges 68, 72 of the transistor active area. Next, the STI oxide is partially recessed, preferably recessed to about 50% of the trench depth. The thin silicon spacers or "edge-fins" are formed along the edges of the active area of the transistor. The edge fins are narrow and may also be used as a transistor channel. Preferably, a transistor channel having a channel width of 0.4 µm may be converted to a plurality of narrow width edge fins each having a width of less than 0.2 µm.

Narrow or thin spacers, much like a thin "fin" used in FinFET on SOI technology, are desirable so that transistor can have the advantages of "thin-body" effect.

The polysilicon metal gate overlapping the edge-fins and trench side-walls offers excellent control of the transistor channel, similar to the control provided by the double-gate transistors on SOI. The source and the drain is also "raised" higher than each trench side-wall so that short-channel effect is improved by suppressing the electrostatic coupling between the source and drain through bulk.

Figure 9A:
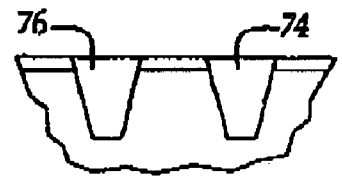
FIG. 9a illustrates an optional field implant that can be added for isolation after a shallow trench isolation is formed with oxide filled insides.

FIGS. 9a-f illustrate a more detailed process flow for transistors having a quasi-planar channel further having edge-fins and side-walls in accordance with the device structure shown in FIGS. 5-6. The process used in FIGS. 9a-f is similar to the process used in FIGS. 8a-f, where shallow trenches are initially formed and filled with oxide. As shown in FIG. 9a an optional field implant can be added for isolation after the STI is formed.

Figure 9B:
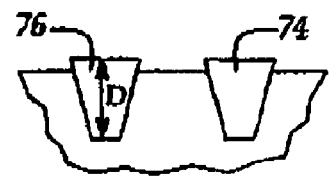
FIG. 9b illustrates the removal of a nitride and a pad-ox layer over silicon active regions.
Figure 9C:
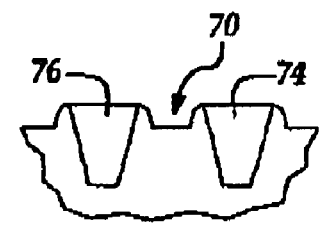
FIG. 9c illustrates the formation of silicon spacer and edge fins.

Then, nitride and pad-ox removal (on the active are of silicon) is performed as shown in FIG. 9b. After removal of the pad-ox, the silicon is recessed to form a recessed spacer region 70. Preferably, the silicon is recessed to about 25% of the trench depth as shown in FIG. 9c. Additionally an annealing process, such as a rapid thermal anneal (RTA) process is performed to repair damage and defects in the spacer recessed region and the STI trench.

Figure 9D:
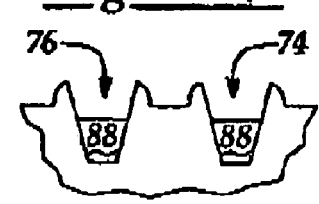
FIG. 9d illustrates the recessing of STI oxide layer for partially filling two STI trenches.

Next, as shown in FIG. 9d, the STI trench oxide 88 is recessed by dry etching. Preferably, the trench oxide 88 is recessed to about 50% of the trench depth. However, the depth that the trench oxide is recessed may range between 20 and 80 percent of the total trench depth. A thin sacrificial oxide (sac-ox) is then thermally grown on the substrate (not shown) for removing defects induced by plasma dry etching of oxide and silicon.

After the sac-ox is grown, p-type and n-type well implants are implanted. After well implantation is performed and sac-ox is removed, a gate dielectric (eg. Silicon oxide), preferably, has a thickness ranging between 10 Å and 70 Å.

Figure 9E:
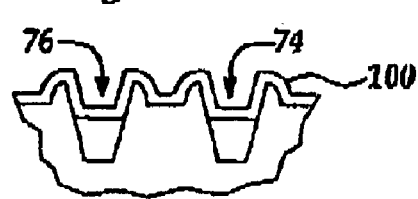
FIG. 9e illustrates the $1^{st}$ deposition of a doped polysilicon deposition layer.

Next, as shown in FIG. 9e, a polysilicon layer 100 having a thickness in a range of about 400 Å to 800 Å is deposited and is pre-doped to reduce polysilicon depletion along the trench side-wall. Polysilicon is the preferable gate electrode material used in MOS devices.

Figure 9F:
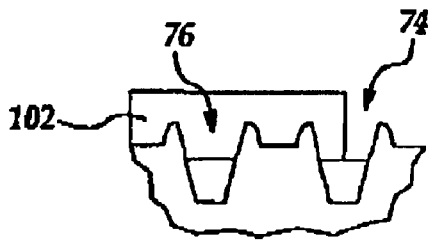
FIG. 9f illustrates the $2^{nd}$ deposition of a non-doped polysilicon deposition layer.

As shown in FIG. 9f, a second polysilicon layer 102 having a thickness in a range of about 400 Å to 800 Å is deposited to fill up each STI trench in accordance with a minimum design rule.

The poly-silicon gate is patterned by the masking and plasma etching steps as shown in FIG. 9f. The process continues as in conventional CMOS process, e.g. source and drain regions e.g., 90 as shown in FIG. 5 are defined, implanted, silicided, etc.

Additionally, another embodiment of the present invention (not shown) applies an extra mask to open the portion of the FinFET-like device for those process steps dedicated to FinFET-like device, e.g. STI oxide recess and silicon etching for edge spacer formation. Therefore, this allows for conventional transistors and FinFET-like transistors fabricated on bulk together.

The extra mask may also be used for protecting the source and drain of FinFET-like transistors from further recess etching of the silicon substrate. Equivalently, this further raises the source and drain with respect to the channel and results in greater advantages of the "raised source and drain".

From the foregoing, it should be appreciated that several quasi-planar FinFET-like devices and their associated fabrication methods have been provided.

While a preferred exemplary embodiment has been presented in the foregoing detailed description, it should be understood that a vast number of variations exist and this preferred exemplary embodiment is merely an example, and it is not intended to limit the scope, applicability or configuration of the invention in any way. Rather, the foregoing detailed description provides those of ordinary skill in the art with a convenient guide for implementing a preferred embodiment of the invention and various changes can be made in the function and arrangements of the exemplary embodiment without departing from the spirit and scope of the appended claims.

What is claimed is:

1. A quasi-planar FinFET device comprising:
a semiconductor substrate having a top wall and at least one first recessed region wherein said at least one first recessed region comprises a trench having a sidewall and a bottom wall;
an insulating layer partially filling said recessed region; and
a first doped region at said sidewall of said at least one first recessed region above said insulating layer adjacent said top wall, said first doped region comprising a conduction channel of said quasi-planar FinFET device, said top wall comprising a source or drain region of said FinFET device, said top wall comprises an additional recessed region juxtaposed to a top edge of said at least one recessed region sidewall, wherein said additional recessed region comprises a trench having a depth less than said at least one first recessed region and a bottom wall of said additional recessed region comprises said source or drain region.

2. The device of claim 1, wherein the semiconductor is silicon.

3. The device of claim 1, wherein the semiconductor comprises silicon-germanium.

4. The device of claim 1, further comprising an second recessed region, said second recessed region comprising a trench partially filled with a second insulating layer and spaced apart from said at least one first recessed region to define an active region, said active region comprising said top wall, said first doped region, and a second doped region comprising a sidewall of said second recessed region.

5. The device of claim 1, further comprising:
a gate dielectric layer grown at said top wall of said substrate and on said doped side-wall region of said at least one recessed region, wherein the gate dielectric has a dielectric constant of no less than about 4.

6. The device of claim 5, further comprising a gate electrode on the gate dielectric layer on both said top wall of said substrate and on said doped side-wall region of said at least one recessed region.

7. The device of claim 6, wherein the gate electrode comprises polysilicon.

8. The device of claim 6, wherein the gate electrode comprises a metal selected from the group consisting of Ti, Ta, Mo, Nb and W.

9. The device of claim 6, wherein the gate electrode comprises a metal alloy comprising Ni.

10. The device of claim 1, wherein the sidewall comprises a nitrogen containing layer.

11. A quasi-planar FinFET device comprising:
a semiconductor substrate having a top wall and at least one first recessed region of said substrate, wherein the at least one first recessed region comprises a trench having a side-wall and a bottom wall;
an insulating layer partially filling said at least one first recessed region;
a first doped region at said side-wall of said at least one first recessed region above said insulating layer adjacent said top wall, said doped region comprising a conduction channel of said quasi-planar FinFET device;
at least one additional recessed region in said top wall juxtaposed to a top edge of said at least one first recessed region side-wall, wherein said at least one additional recessed region comprises a trench having a depth less than said at least one first recessed region, a bottom wall of said at least one additional recessed region comprising a source or drain region of said FinFET device.

12. The device of claim 11, wherein the at least one additional recessed region comprises at least two fins comprising side-wall portions of said at least one additional recessed region.

13. The device of claim 11, wherein said at least one additional recessed region has a depth ranging between about 10% to and about 35% of a depth of said least one first recessed region.

14. The device of claim 11, further comprising a gate dielectric layer grown at said top wall of said silicon substrate and on said doped side-wall region of said at least one first recessed region and said at least one additional recessed region, wherein the gate dielectric has a dielectric constant of no less than about 4.

15. The device of claim 14, further comprising a gate electrode on the gate dielectric layer on both said top wall of said substrate and on said doped side-wall region of said at least one first recessed region and said at least one additional recessed region.

16. The device of claim 11, further comprising a silicide layer formed over said source or drain region.

17. The device of claim 11, further comprising a second doped region on said top wall of said at least one additional recessed region comprising said at least two fins, said first and second doped regions comprising a conduction channel of said quasi-planar FinFET device.

18. The device of claim 14, wherein the gate electrode is a polysilicon.

19. The device of claim 14, wherein the gate electrode comprises a metal selected from the group consisting of Ti, Ta, Mo, Nb and W.

20. The device of claim 14, wherein the gate electrode comprises a metal alloy comprising Ni.

21. The device of claim 1, wherein said additional recessed region has a depth ranging between about 10% to and about 35% of a depth of said at least one recessed region.

22. The device of claim 1, wherein the additional recessed region comprises at least two fins comprising side-wall portions of said second recessed region.

23. The device of claim 1, further comprising a second doped region on said top wall of said at least one additional recessed region comprising said at least two fins, said first and second doped regions comprising a conduction channel of said quasi-planar FinFET device.

24. The device of claim 1, wherein said insulating layer fills said at least one recessed region to a depth ranging between about 10 and about 80 percent of said at least one recessed region depth.

25. The device of claim 11, further comprising a second recessed region, said second recessed region comprising a trench partially filled with a second insulating layer and spaced apart from said at least one first recessed region to define an active region, said active region comprising said top wall, said first doped region, and a second doped region comprising a sidewall of said second recessed region.

26. A quasi-planar FinFET device comprising:
a semiconductor substrate having a top wall and at least one first recessed region of said substrate, wherein the at least one first recessed region comprises a trench having a side-wall and a bottom wall;
a first insulating layer partially filling said at least one first recessed region;
a first doped region at said side-wall of said at least one first recessed region to form a doped sidewall region, said first doped region above said insulating layer adjacent said top wall, said first doped region comprising a conduction channel of said quasi-planar FinFET device;
at least one additional recessed region in said top wall juxtaposed to a top edge of said at least one first recessed region side-wall, wherein said at least one additional recessed region comprises a trench having a depth less than said at least one first recessed region, a bottom wall of said at least one additional recessed region comprising a source or drain region of said FinFET device; and,
a second recessed region, said second recessed region comprising a trench partially filled with a second insulating layer and spaced apart from said at least one first recessed region to define an active region comprising said top wall, said first doped region, and a second doped region comprising a sidewall of said second recessed region.

27. The device of claim 26, wherein the at least one additional recessed region comprises at least two fins comprising side-wall portions of said at least one second recessed region.

28. The device of claim 26, wherein said at least one additional recessed region has a depth ranging between about 10% to and about 35% of a depth of said least one first recessed region.

29. The device of claim 26, further comprising a gate dielectric layer grown at said top wall of said silicon substrate and on said doped side-wall region of said at least one first recessed region and said at least one additional recessed region, wherein the gate dielectric has a dielectric constant of no less than about 4.

30. The device of claim 29, further comprising a gate electrode on the gate dielectric layer on both said top wall of said substrate and on said doped side-wall region of said first at least one recessed region and said at least one additional recessed region.

31. The device of claim 30, wherein the gate electrode is a polysilicon.

32. The device of claim 30, wherein the gate electrode comprises a metal selected from the group consisting of Ti, Ta, No, Nb and W.

33. The device of claim 30, wherein the gate electrode comprises a metal alloy comprising Ni.

34. The device of claim 26, further comprising a suicide layer formed over said source or drain region.

35. The device of claim 26, further comprising a second doped region on said top wall of said at least one additional recessed region comprising said at least two fins, said first and second doped regions comprising a conduction channel of said quasi-planar FinFET device.

36. The device of claim 26, wherein said first and second insulating layers respectively fill said first and second recessed regions to a depth ranging between about 10 and about 80 percent of said respective recessed regions depth.

37. The device of claim 1, wherein the at least one recessed region is a shallow trench isolation (STI) region.

38. The device of claim 11, wherein the at least one first recessed region is a shallow trench isolation (STI) region.

39. The device of claim 26, wherein the first and second recessed regions are shallow trench isolation (STI) regions.

* * * * *